United States Patent
Park et al.

(10) Patent No.: US 10,833,254 B2
(45) Date of Patent: Nov. 10, 2020

(54) ENGINEERED BARRIER LAYER INTERFACE FOR HIGH SPEED SPIN-TRANSFER TORQUE MAGNETIC RANDOM ACCESS MEMORY

(71) Applicant: QUALCOMM Incorporated, San Diego, CA (US)

(72) Inventors: Chando Park, Palo Alto, CA (US); Jimmy Jianan Kan, San Diego, CA (US); Peiyuan Wang, San Diego, CA (US); Seung Hyuk Kang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/431,490

(22) Filed: Jun. 4, 2019

(65) Prior Publication Data
US 2019/0288187 A1    Sep. 19, 2019

Related U.S. Application Data

(63) Continuation of application No. 15/467,803, filed on Mar. 23, 2017, now Pat. No. 10,431,734.

(60) Provisional application No. 62/450,030, filed on Jan. 24, 2017.

(51) Int. Cl.
| | |
|---|---|
| *H01L 43/06* | (2006.01) |
| *H01L 43/10* | (2006.01) |
| *H01L 43/12* | (2006.01) |
| *G11C 11/16* | (2006.01) |
| *H01L 43/08* | (2006.01) |
| *H01F 10/32* | (2006.01) |

(52) U.S. Cl.
CPC ............ *H01L 43/10* (2013.01); *G11C 11/161* (2013.01); *H01F 10/3286* (2013.01); *H01L 43/08* (2013.01); *H01L 43/12* (2013.01)

(58) Field of Classification Search
CPC ......... H01L 43/00; H01L 43/10; H01L 43/02; H01L 43/08; H01L 43/12; H01L 27/22; H01L 27/222; H01L 27/302; H01L 27/228; H01L 43/06; H01L 27/226
USPC .......................................................... 438/48
See application file for complete search history.

(56) References Cited

U.S. PATENT DOCUMENTS

| | | | |
|---|---|---|---|
| 6,483,675 B1 | 11/2002 | Araki et al. | |
| 7,238,979 B2 | 7/2007 | Horng et al. | |
| 8,436,437 B2 | 5/2013 | Horng et al. | |
| 8,772,845 B2 | 7/2014 | Chen et al. | |
| 2013/0264665 A1* | 10/2013 | Jan ........................... | H01L 43/08 257/421 |
| 2014/0103469 A1* | 4/2014 | Jan ........................... | H01L 43/10 257/421 |

(Continued)

OTHER PUBLICATIONS

International Search Report and Written Opinion—PCT/US2017/062636—ISA/EPO—dated Feb. 26, 2018.

*Primary Examiner* — Chuong A Luu
(74) *Attorney, Agent, or Firm* — Seyfarth Shaw LLP

(57) ABSTRACT

A perpendicular magnetic tunnel junction may include a free layer, a reference layer, and a barrier layer. The barrier layer may be arranged between the free layer and the reference layer. The barrier layer may include a first interface and a second interface. The first interface may face the free layer, and a second interface may face the reference layer. The first interface may not physically correlate with the second interface.

5 Claims, 11 Drawing Sheets

(56) References Cited

U.S. PATENT DOCUMENTS

| | | |
|---|---|---|
| 2015/0311427 A1 | 10/2015 | Gottwald et al. |
| 2017/0179372 A1 | 6/2017 | Braganca et al. |
| 2018/0040668 A1 | 2/2018 | Park et al. |
| 2018/0061467 A1 | 3/2018 | Kan et al. |
| 2018/0212142 A1 | 7/2018 | Park et al. |
| 2019/0288187 A1 | 9/2019 | Park et al. |
| 2019/0288189 A1 | 9/2019 | Jan et al. |

* cited by examiner

Conformal Roughness (Correlated)

After Plasma Treatment (Uncorrelated)

ENGINEERED BARRIER LAYER INTERFACE FOR HIGH SPEED SPIN-TRANSFER TORQUE MAGNETIC RANDOM ACCESS MEMORY

CROSS REFERENCE TO RELATED APPLICATION

The present application is a continuation of U.S. patent application Ser. No. 15/467,803, filed on Mar. 23, 2017, and titled "ENGINEERED BARRIER LAYER INTERFACE FOR HIGH SPEED SPIN-TRANSFER TORQUE MAGNETIC RANDOM ACCESS MEMORY," and claims the benefit of U.S. Provisional Patent Application No. 62/450,030, filed on Jan. 24, 2017, and titled "ENGINEERED BARRIER LAYER INTERFACE FOR HIGH SPEED SPIN-TRANSFER TORQUE MAGNETIC RANDOM ACCESS MEMORY," the disclosures of which are expressly incorporated by reference herein in their entireties.

TECHNICAL FIELD

Certain aspects of the present disclosure generally relate to magnetic tunneling junction (MTJ) devices, and more particularly to an engineered barrier layer interface for a high speed spin-transfer torque magnetic random access memory (STT-MRAM).

BACKGROUND

Unlike conventional random access memory (RAM) chip technologies, in magnetic RAM (MRAM), data is stored by magnetization of storage elements. The basic structure of the storage elements consists of metallic ferromagnetic layers separated by a thin tunneling barrier. One of the ferromagnetic layers (e.g., the ferromagnetic layer underneath the barrier) has a magnetization that is fixed in a particular direction, and is commonly referred to as the reference layer, which is interchangeably referred to as the fixed layer. The other ferromagnetic layers (e.g., the ferromagnetic layer above the tunneling barrier) have a magnetization direction that may be altered to represent either a "1" or a "0," and are commonly referred to as the free layers.

For example, a "1" may be represented when the free layer magnetization is anti-parallel to the fixed layer magnetization. In addition, a "0" may be represented when the free layer magnetization is parallel to the fixed (reference) layer magnetization or vice versa. One such device having a fixed (reference) layer, a tunneling layer, and a free layer is a magnetic tunnel junction (MTJ). The electrical resistance of an MTJ depends on whether the free layer magnetization and fixed layer magnetization are parallel or anti-parallel to each other. A memory device such as MRAM is built from an array of individually addressable MTJs.

To write data in a conventional MRAM, a write current, which exceeds a critical switching current, is applied through an MTJ. Application of a write current that exceeds the critical switching current changes the magnetization direction of the free layer. When the write current flows in a first direction (from a free layer to a reference layer), the MTJ may be placed into or remain in a state in which its free layer magnetization direction and reference layer magnetization direction are aligned in a parallel orientation. When the write current flows in a second direction (from the reference layer to the free layer), opposite to the first direction, the MTJ may be placed into or remain in a second state in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a parallel resistance. The parallel resistance is different than a resistance (anti-parallel) the MTJ would present if the magnetizations of the free layer and the fixed layer were in an anti-parallel orientation. In a conventional MRAM, two distinct states are defined by these two different resistances of an MTJ in a bitcell of the MRAM. The two different resistances indicate whether a logic "0" or a logic "1" value is stored by the MTJ.

Spin-transfer torque magnetic random access memory (STT-MRAM) is an emerging nonvolatile memory that has advantages of non-volatility. In particular, STT-MRAM embedded with logic circuits may operate at a comparable or higher speed than off chip dynamic random access memory (DRAM). In addition, STT-MRAM has a smaller chip size than embedded static random access memory (eSRAM), virtually unlimited read/write endurance as compared with FLASH, and a low array leakage current.

In particular, spin-transfer torque (STT) efficiency and retention are specified parameters in the design of the MTJ for an embedded STT-MRAM. As a result, perpendicular STT-MRAM has become a leading candidate for providing next-generation embedded non-volatile memory. While STT-MRAM is a promising candidate for use as a unified memory for a low power MCU (memory control unit) or IoT (Internet of things) applications, STT-MRAM is still not fast/low-power enough to serve as cache replacement memory (e.g., low level cache (LLC) or otherwise).

SUMMARY

A perpendicular magnetic tunnel junction may include a free layer, a reference layer, and a barrier layer. The barrier layer may be arranged between the free layer and the reference layer. The barrier layer may include a first interface and a second interface. The first interface may face the free layer, and a second interface may face the reference layer. The first interface may not physically correlate with the second interface.

A method of making a perpendicular magnetic tunnel junction (pMTJ) may include depositing a barrier layer on a reference layer of the pMTJ. The method may also include treating an exposed surface of the barrier layer. The exposed surface of the barrier layer may not physically correlate with an opposing surface of the barrier layer. The method may further include depositing a free layer on the exposed surface of the barrier layer of the pMTJ.

A magnetic random access memory (MRAM) array may include a plurality of bit cells. Each of the plurality of bit cells may also include a perpendicular magnetic tunnel junction (pMTJ). The pMTJ may further include a barrier layer between a free layer and a reference layer. The barrier layer may include a reference layer interface that faces the reference layer. The barrier layer may also include means for inducing an initial angle of magnetization between the reference layer and the free layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
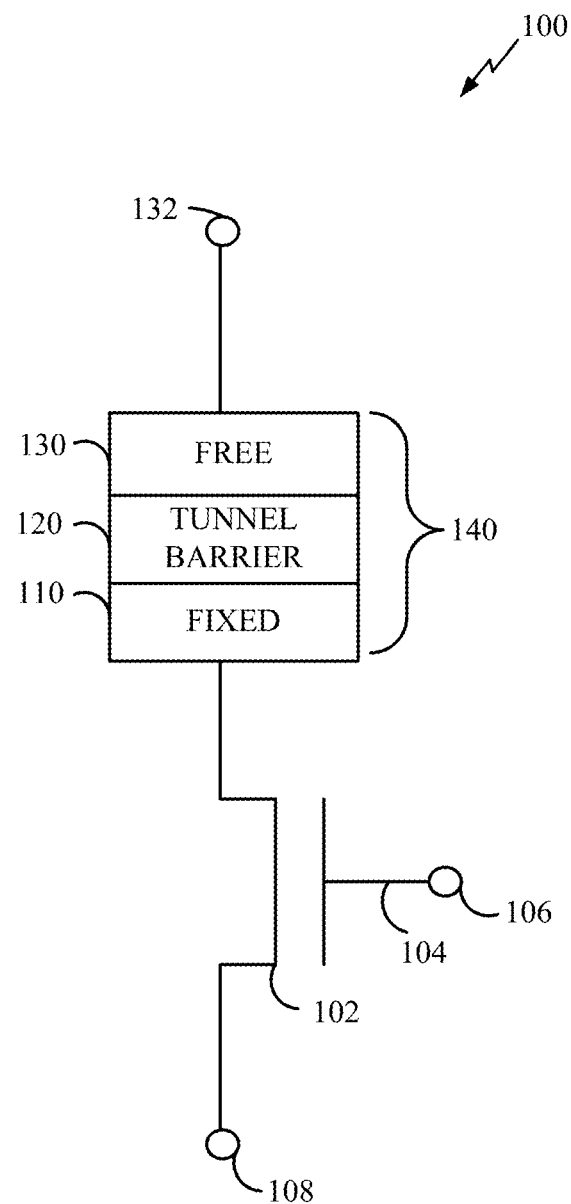
FIG. 1 is a diagram of a magnetic tunnel junction (MTJ) device connected to an access transistor.

The detailed description set forth below, in connection with the appended drawings, is intended as a description of various configurations and is not intended to represent the only configurations in which the described concepts may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR," and the use of the term "or" is intended to represent an "exclusive OR."

Spin-transfer torque magnetic random access memory (STT-MRAM) is an emerging nonvolatile memory that has advantages of non-volatility. In particular, STT-MRAM embedded with logic circuits may operate at a comparable or higher speed than off chip dynamic random access memory (DRAM). In addition, STT-MRAM has a smaller chip size than embedded static random access memory (eSRAM), virtually unlimited read/write endurance as compared with FLASH, and a low array leakage current. In particular, STT-MRAM is fast, and non-volatile, relative to other non-volatile memory options, such as resistive RAM (RRAM), ferroelectric RAM (FRAM), eFlash, and the like.

Spin-transfer torque (STT) efficiency and retention are design parameters for an embedded STT-MRAM that are improved when a perpendicular MTJ (pMTJ) is used as a memory cell. As a result, perpendicular STT-MRAM is a leading candidate for providing next-generation embedded non-volatile memory. While perpendicular STT-MRAM is a promising candidate for use as a unified memory for a low power MCU (memory control unit) or IoT (Internet of things) applications, perpendicular STT-MRAM is still not fast/low-power enough to serve as cache replacement memory (e.g., low level cache (LLC) or otherwise).

In particular, when an initial angle of the magnetizations between a free layer and a reference (e.g., fixed) layer is parallel or anti-parallel (e.g., 0 or 180 degrees), a spin-transfer torque effect is zero, which prevents switching. This initial angle may be disturbed by using a high current or a high pulse width. As described below, an incubation time delay refers to an incubation time for disturbing the initial angle of magnetization between the free layer and the reference layer of the pMTJ. This resulting non-negligible incubation delay for setting the initial angle limits the use of STT-MRAM for ultrafast switching and induces a broad switching time distribution. This incubation time delay, therefore, prevents the use of conventional STT-MRAM in, for example, high speed switching, low current cache memory applications.

Various aspects of the disclosure provide techniques for setting an initial angle of magnetization between a free layer and a reference layer in a pMTJ of an STT-MRAM. The process flow for manufacturing a pMTJ may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described below, the term "substrate" may refer to a substrate of a diced wafer or may refer to the substrate of a wafer that is not diced. Similarly, the terms wafer and die may be used interchangeably unless such interchanging would tax credulity.

As described, the back-end-of-line interconnect layers may refer to the conductive interconnect layers (e.g., metal one (M1), metal two (M2), metal three (M3), etc.) for electrically coupling to front-end-of-line active devices of an integrated circuit. The back-end-of-line interconnect layers may electrically couple to middle-of-line interconnect layers, for example, connecting M1 to an oxide diffusion (OD) layer of an integrated circuit. A back-end-of-line first via (V2) may connect M2 to M3 or others of the back-end-of-line interconnect layers. The front-end-of-line processes may include the set of process steps that form the active devices, such as transistors, capacitors, and diodes. The front-end-of-line processes include ion implantation, anneals, oxidation, CVD (chemical vapor deposition) or ALD (atomic layer deposition), etching, CMP (chemical mechanical polishing), and epitaxy.

The middle-of-line processes may include the set of process steps that enable connection of the transistors to the back-end-of-line interconnects (e.g., M1 . . . M8). These steps include silicidation and contact formation as well as stress introduction. The back-end-of-line processes may include the set of process steps that form the interconnect that ties the independent transistors and form circuits. Currently, copper and aluminum are used to form the interconnects, but with further development of the technology, other conductive material may be used.

An STT-MRAM for high speed, low current applications is described. In aspects of the present disclosure, an initial angle of magnetization between a free layer and a reference layer of the pMTJs of the STT-MRAM may be engineered through a process that may reduce or even eliminate an incubation time delay. This interface engineered STT-MRAM may support high speed switching, low current cache memory applications. In particular, an interface engineered barrier layer may support high speed STT-MRAM, while using a low current. For example, different barrier layer interfaces may create an angle between the free layer and reference layer magnetizations that may reduce or eliminate the incubation delay time.

In aspects of the present disclosure, the pMTJ may include a reference (e.g., fixed) layer, a free layer, and a barrier layer between the reference layer and the free layer. The barrier layer may include a first interface that faces the free layer and a second interface that faces the reference layer. An initial angle of the magnetizations between the reference layer and free layer may be adjusted by not physically correlating the first interface with the second interface of the barrier layer. According to aspects of the present disclosure, the initial angle of magnetization between the free layer and the reference layer may be set by the first interface not physically correlating with the second interface.

FIG. 1 illustrates a memory cell 100 of a memory device including a magnetic tunnel junction (MTJ) 140 coupled to an access transistor 102. The memory device may be a magnetic random access memory (MRAM) device that is built from an array of individually addressable MTJs. An MTJ stack may include a free layer, a fixed layer and a tunnel barrier layer there between as well as one or more ferromagnetic (or anti-ferromagnetic) layers. Representatively, a free layer 130 of the MTJ 140 is coupled to a bit line 132. The access transistor 102 is coupled between a fixed layer 110 of the MTJ 140 and a fixed potential node 108. A tunnel barrier layer 120 is coupled between the fixed layer 110 and the free layer 130. The access transistor 102 includes a gate 104 coupled to a word line 106.

Synthetic anti-ferromagnetic materials may form the fixed layer 110 and the free layer 130. For example, the fixed layer 110 may include multiple material layers including a cobalt-iron-boron (CoFeB) layer, a ruthenium (Ru) layer and a cobalt-iron (CoFe) layer. In addition, the free layer 130 may also include multiple material layers including a cobalt-iron-boron (CoFeB) layer, a ruthenium (Ru) layer and a cobalt-iron (CoFe) layer. Further, the tunnel barrier layer 120 may be magnesium oxide (MgO).

Figure 2:
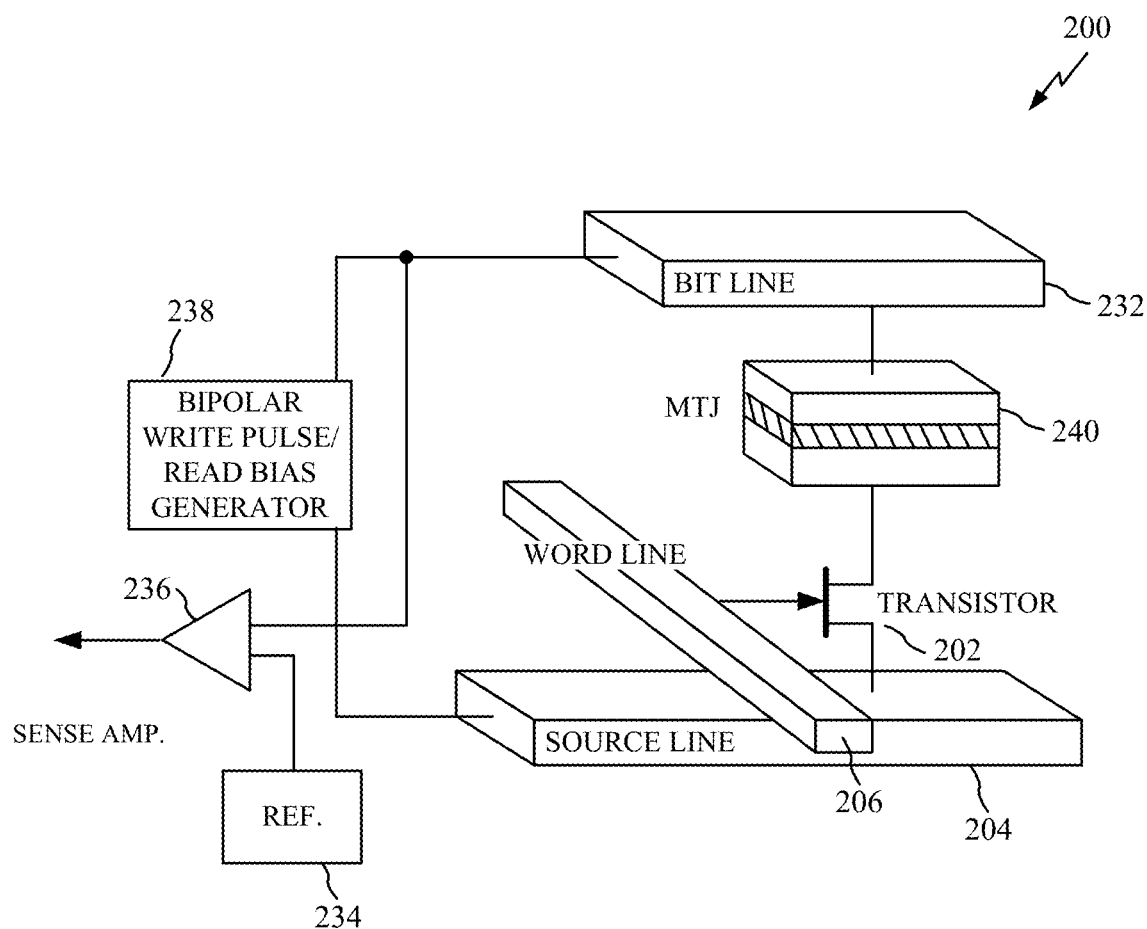
FIG. 2 is a conceptual diagram of a conventional magnetic random access memory (MRAM) cell including an MTJ.

FIG. 2 illustrates a conventional STT-MRAM bit cell 200. The STT-MRAM bit cell 200 includes a magnetic tunnel junction (MTJ) storage element 240, a transistor 202, a bit line 232 and a word line 206. The MTJ storage element 240 is formed, for example, from at least two anti-ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The magnetic polarization of the free layer can be reversed so that the polarity of the pinned layer and the free layer are either substantially aligned or opposite. The resistance of the electrical path through the MTJ varies depending on the alignment of the polarizations of the pinned and free layers. This variance in resistance may program and read the bit cell 200. The STT-MRAM bit cell 200 also includes a source line 204, a sense amplifier 236, read/write circuitry 238 and a bit line reference 234

Materials that form a magnetic tunnel junction (MTJ) of an MRAM generally exhibit high tunneling magneto resistance (TMR), high perpendicular magnetic anisotropy (PMA) and good data retention. MTJ structures may be made in a perpendicular orientation, referred to as perpendicular magnetic tunnel junction (pMTJ) devices. A stack of materials (e.g., cobalt-iron-boron (CoFeB) materials) with a dielectric barrier layer (e.g., magnesium oxide (MgO)) may be employed in a pMTJ structure. A pMTJ structure including a stack of materials (e.g., CoFeB/MgO/CoFeB) has been considered for MRAM structures.

Figure 3:
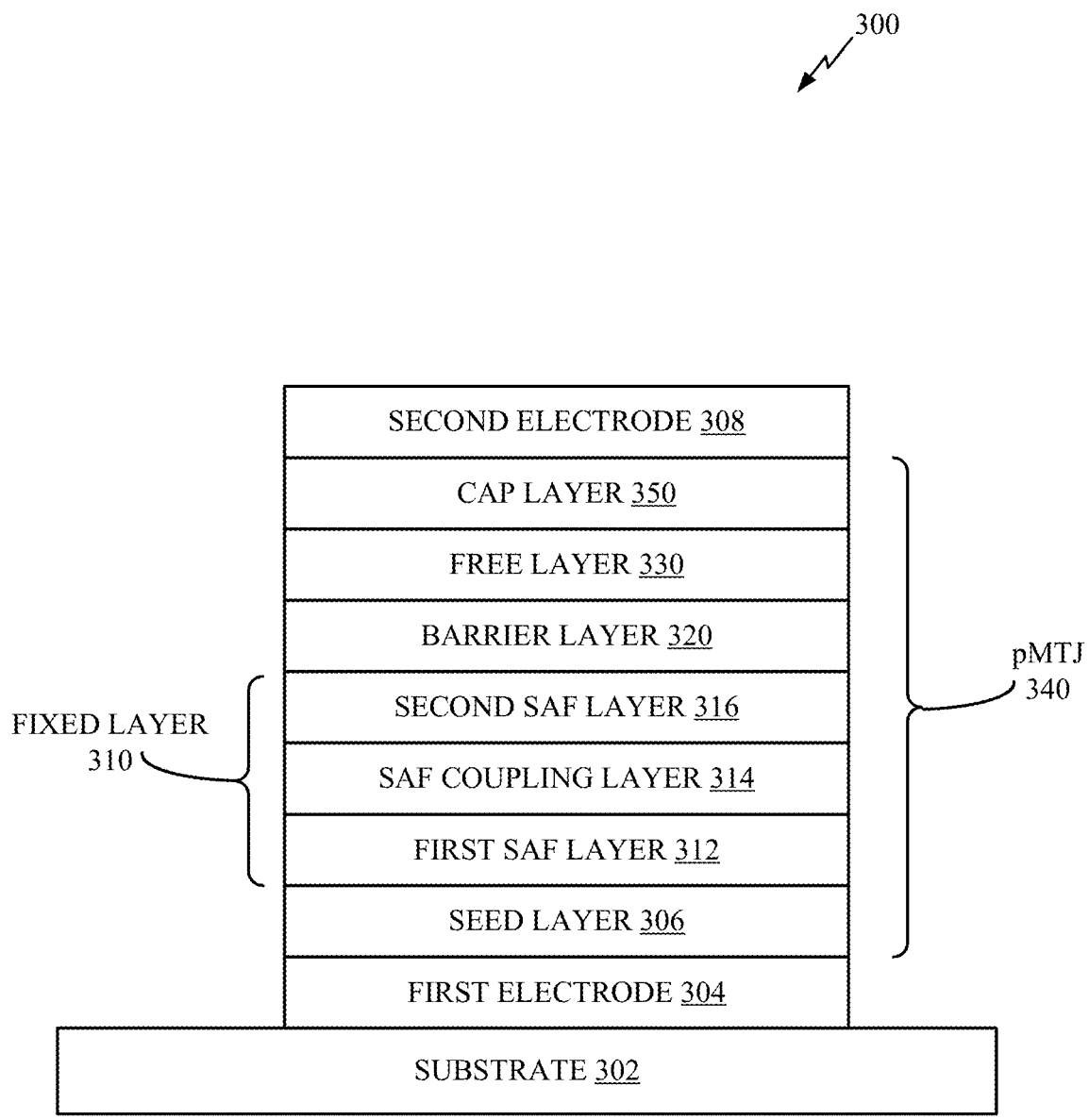
FIG. 3 is a cross-sectional diagram illustrating a conventional perpendicular magnetic tunnel junction (pMTJ) structure.

FIG. 3 illustrates a cross-sectional view of a conventional perpendicular magnetic tunnel junction (pMTJ) structure. Representatively, an MTJ structure 300, which is shown as a pMTJ 340 in FIG. 3, is formed on a substrate 302. The MTJ structure 300 may be formed on a semiconductor substrate, such as a silicon substrate, or any other alternative suitable substrate material. The MTJ structure 300 may include a first electrode 304, a seed layer 306, and a fixed layer 310. The fixed layer 310 includes a first synthetic antiferromagnetic (SAF) layer 312, a SAF coupling layer 314, and a second SAF layer 316. The MTJ structure 300 also includes a barrier layer 320, a free layer 330, a cap layer 350 (also known as a capping layer), and a second electrode 308. The MTJ structure 300 may be a part of various types of devices, such as a semiconductor memory device (e.g., MRAM).

In this configuration, the first electrode 304 and the second electrode 308 include conductive materials (e.g., tantalum (Ta)). In other configurations, the first electrode 304 and/or second electrode 308 may include other appropriate materials, including but not limited to platinum (Pt), copper (Cu), gold (Au), aluminum (Al), or other like conductive materials. The first electrode 304 and the second electrode 308 may employ different materials within the MTJ structure 300.

A seed layer 306 is formed on the first electrode 304. The seed layer 306 may provide a mechanical and crystalline substrate for the first SAF layer 312. The seed layer 306 may be a compound material, including but not limited to, nickel chromium (NiCr), nickel iron (NiFe), NiFeCr, or other suitable materials for the seed layer 306. When the seed layer 306 is grown or otherwise coupled to the first electrode 304, a smooth and dense crystalline structure results in the seed layer 306. In this configuration, the seed layer 306 promotes growth of subsequently formed layers in the MTJ structure 300 according to a specific crystalline orientation. The crystalline structure of the seed layer 306 may be selected to be any crystal orientation within the Miller index notation system, but is often chosen to be in the (111) crystal orientation.

A first SAF layer 312 is formed on the seed layer 306. The first SAF layer 312 includes a multilayer stack of materials formed on the seed layer 306, which may be referred to herein as a first anti-parallel pinned layer (AP1). The multilayer stack of materials in the first SAF layer 312 may be an anti-ferromagnetic material or a combination of materials to create an anti-ferromagnetic moment in the first SAF layer 312. The multilayer stack of materials forming the first SAF layer 312 include, but are not limited to, cobalt (Co), cobalt in combination with other materials such as nickel (Ni), platinum (Pt), or palladium (Pd), or other like ferromagnetic materials.

An SAF coupling layer 314 is formed on the first SAF layer 312, and promotes magnetic coupling between the first SAF layer 312 and a second SAF layer 316. The second SAF layer 316 has a magnetic orientation anti-parallel with the first SAF layer 312. The SAF coupling layer 314 includes material that aides in this coupling including, but not limited to, ruthenium (Ru), tantalum (Ta), gadolinium (Gd), platinum (Pt), hafnium (Hf), osmium (Os), rhodium (Rh), niobium (Nb), terbium (Tb), or other like materials. The SAF coupling layer 314 may also include materials to provide mechanical and/or crystalline structural support for the first SAF layer 312 and the second SAF layer 316.

The second SAF layer 316 is formed on the SAF coupling layer 314. The second SAF layer 316 may have similar materials as the first SAF layer 312, but may include other materials. The combination of the first SAF layer 312, the SAF coupling layer 313, and the second SAF layer 316 forms the fixed layer 310 including the SAF reference layers, which is often referred to as a "pinned layer" in the MTJ structure 300. The fixed layer 310 fixes, or pins, the magnetization direction of the SAF reference layers (e.g., 312, 314, 316) through anti-ferromagnetic coupling. As described, the second SAF layer 316 may be referred to as a second anti-parallel pinned layer (AP2). In this arrangement, the first SAF layer 312 may be referred to as a first anti-parallel pinned layer (AP1) that is separated from the second anti-parallel pinned layer (AP2) by the SAF coupling layer 314 to form the fixed layer 310. The fixed layer 310 may include a cobalt-iron-boron (CoFeB) film. The fixed layer 310 may also include other ferromagnetic material layers, such as CoFeTa, NiFe, Co, CoFe, CoPt, CoPd, FePt, or any alloy of Ni, Co and Fe.

A TMR enhancement layer of the fixed layer 310 abutting the barrier layer 320 may be formed of a material, such as CoFeB, that provides a crystalline orientation for the barrier layer 320. As with the seed layer 306, the material in the fixed layer 310 provides a template for subsequent layers to be grown in a specific crystalline orientation. This orientation may be in any direction within the Miller index system, but is often in the (100) (or (001)) crystal orientation.

The barrier layer 320 (also referred to as a tunnel barrier layer) is formed on the fixed layer 310. The barrier layer 320 provides a tunnel barrier for electrons travelling between the fixed layer 310 and the free layer 330. The barrier layer 320, which may include magnesium oxide (MgO), is formed on the fixed layer 310 and may have a crystalline structure. The crystalline structure of the barrier layer 320 may be in the (100) direction. The barrier layer 320 may include other elements or other materials, such as aluminum oxide (AlO), aluminum nitride (AlN), aluminum oxynitride (AlON), or other non-magnetic or dielectric material. The thickness of the barrier layer 320 is selected so that electrons can tunnel from the fixed layer 310 through the barrier layer 320 to the free layer 330 when a biasing voltage is applied to the MTJ structure 300.

The free layer 330, which may be cobalt-iron-boron (CoFeB), is formed on the barrier layer 320. The free layer 330, when initially deposited on the barrier layer 320, is an amorphous structure. That is, the free layer 330 does not have a crystalline structure when initially deposited on the barrier layer 320. The free layer 330 is also an anti-ferromagnetic layer or multilayer material, which may include similar anti-ferromagnetic materials as the fixed layer 310 or may include different materials.

In this configuration, the free layer 330 includes an anti-ferromagnetic material that is not fixed or pinned in a specific magnetic orientation. The magnetization orientation of the free layer 330 is able to rotate to be in a parallel or an anti-parallel direction to the pinned magnetization of the fixed layer 310. A tunneling current flows perpendicularly through the barrier layer 320 depending upon the relative magnetization directions of the fixed layer 310 and the free layer 330.

A cap layer 350 is formed on the free layer 330. The cap layer 350 may be a dielectric layer, or other insulating layer, to allow containment of the magnetic and electric fields between the free layer 330 and the fixed layer 310. The cap layer 350 helps reduce the switching current density that switches the MTJ structure 300 from one orientation (e.g., parallel) to the other (e.g., anti-parallel). The cap layer 350, which may also be referred to as a capping layer, may be an oxide, such as, for example, amorphous aluminum oxide (AlOx) or amorphous hafnium oxide (HfOx). The cap layer 350 may also be other materials, such as magnesium oxide (MgO) or other dielectric materials without departing from the scope of the present disclosure.

The second electrode 308 is formed on the cap layer 350. In one configuration, the second electrode 308 includes tantalum. Alternatively, the second electrode 308 includes any other suitable conductive material for electrical connection of the MTJ structure 300 to other devices or portions of a circuit. Formation of the second electrode 308 on the cap layer 350 completes the MTJ structure 300.

When an initial angle of the magnetizations between the free layer 330 and the fixed layer 310 (e.g., reference layer) is 0 or 180 degrees (e.g., parallel or anti-parallel), a spin-transfer torque effect of the pMTJ 340 is zero, resulting in no switching, This initial angle of magnetization may be conventionally disturbed by using a high current or a high pulse width. Unfortunately, the resulting, non-negligible incubation delay time for setting the initial angle of magnetization between the free layer 330 and the fixed layer 310 prevents the use of the pMTJ 340 for ultrafast switching and induces a broad switching time distribution. This incubation time delay prevents the use of conventional STT-MRAM in, for example, high speed switching, low current cache memory applications.

$$\text{Torque} \propto M_{FL} \times M_{REF} \times M_{FL} \tag{1}$$

Figure 4:
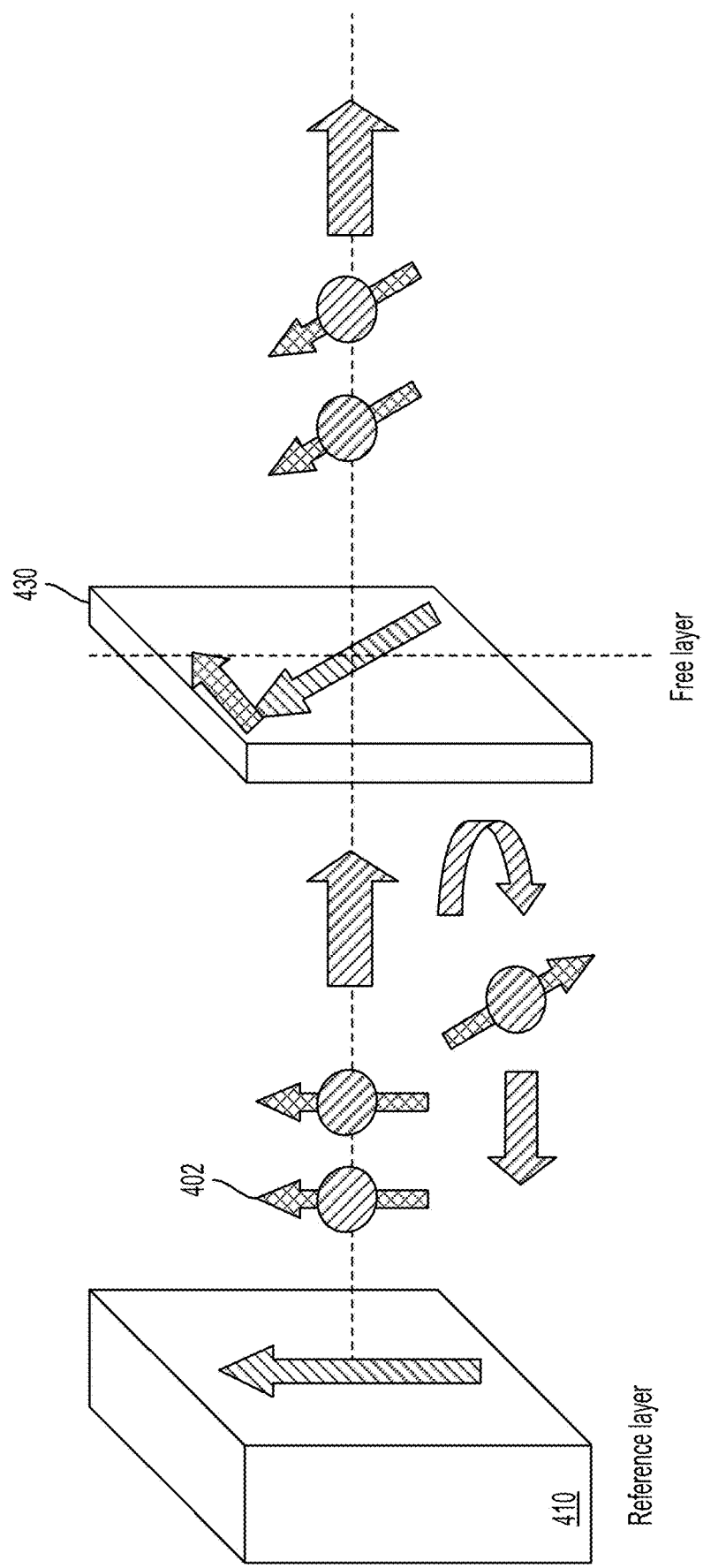
FIG. 4 illustrates spin-polarization of electrons as they pass through a ferromagnetic thin film.

FIG. 4 illustrates spin-polarization of electrons as they pass through a ferromagnetic thin film. In this example, electrons 402 become spin-polarized in the direction of a reference layer (RL) magnetization ($M_{REF}$) when they pass through a ferromagnetic thin film of a reference layer 410. In addition, spin-polarized electrons exert torque on a free layer (FL) magnetization ($M_{FL}$) that modulates (e.g., switches) the free layer magnetization $M_{FL}$ (see equation (1)). When the magnetization of the reference layer $M_{REF}$ and the magnetization of the free layer $M_{FL}$ are parallel or anti-parallel, a spin-transfer torque is zero, which prevents switching.

In conventional free layer switching, this initial angle of magnetization may be disturbed by using a high current or a high pulse width. Unfortunately, the resulting, non-negligible incubation delay time for setting the initial angle of magnetization between the free layer 430 and the reference layer 410 prevents the use of STT-MRAM in ultrafast switching applications. The incubation delay time for setting the initial angle of magnetization between the free layer 430 and the reference layer 410 also induces a broad switching time distribution. Conventional STT-MRAM, therefore, is not used in high speed switching, low current applications, such as cache memory (e.g., level three (L3) or level four (L4) cache memory).

Aspects of the present disclosure are directed to improving the switching/writing of pMTJs by using an engineered barrier layer interface. This interface engineered STT-MRAM may support high speed switching, low current cache memory applications. That is, an interface engineered barrier layer may support high speed STT-MRAM, while using a low current by eliminating the high current conventionally used to disturb the initial angle of magnetization. For example, different barrier layer interfaces may create an angle between the free layer and reference layer magnetizations that may reduce or even eliminate an incubation time for setting the initial angle of magnetization between a free layer 430 and a reference layer 410, for example, as shown in FIG. 5B.

Figure 5A:
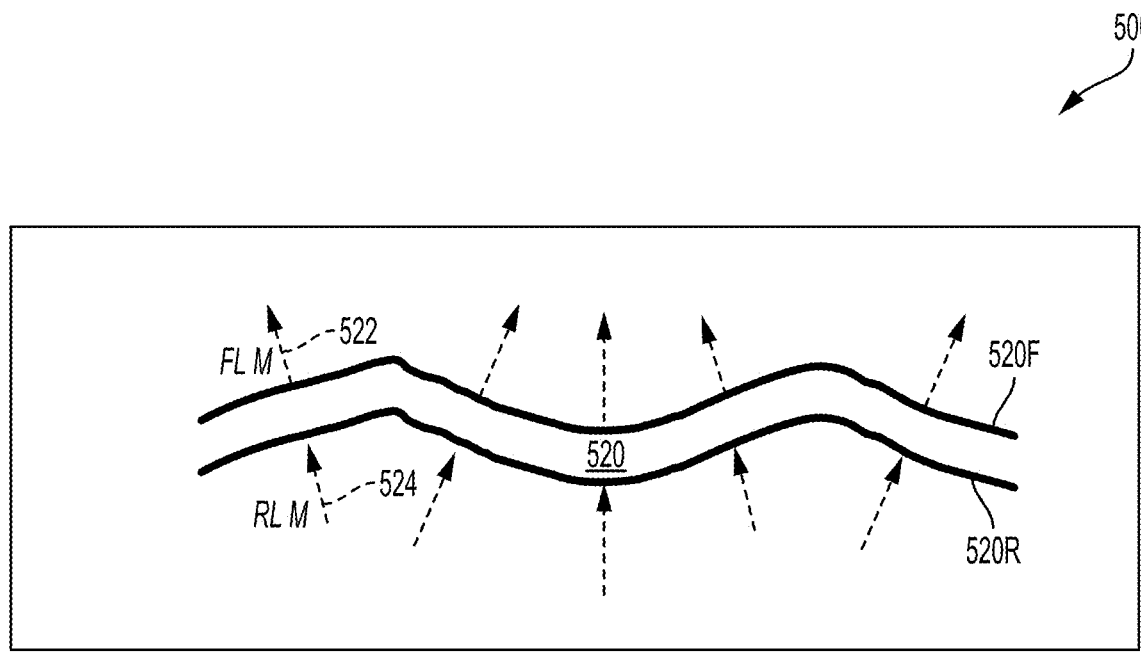
FIGS. 5A and 5B illustrate free layer interfaces and reference layer interfaces of a barrier layer of a pMTJ to provide interface induced magnetization according to aspects of the present disclosure.
Figure 5B:
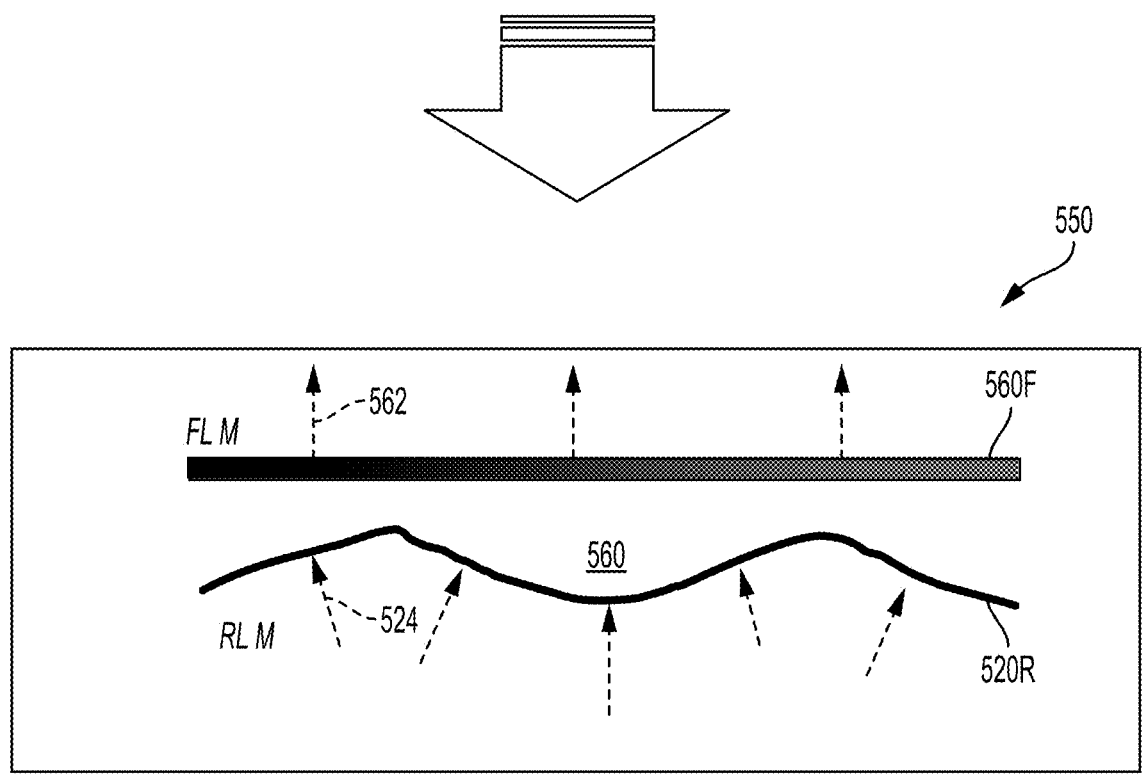

FIGS. 5A and 5B illustrate free layer interfaces and reference layer interfaces of a barrier layer of pMTJ to provide interface induced magnetization according to aspects of the present disclosure. FIG. 5A, shows a pMTJ 500 including a reference layer interface 520R and a free layer interface 520F of a barrier layer 520 between a reference layer and a free layer (not shown). The barrier layer 520 includes the free layer interface 520F that faces the free layer and the reference layer interface 520R that faces the reference layer. In this arrangement, a perpendicular magnetic anisotropy (PMA) of the barrier layer interfaces (e.g., 520F and 502R) is based on an interface induce magnetization (M). Generally, the magnetization M is normal to the barrier layer interface, as indicated by magnetization arrows.

In FIG. 5A, the reference layer interface 520R and the free layer interface 520F of the barrier layer 520 are conformal. Representatively, an initial magnetic angle between a free layer magnetization (FL M) and a reference layer magnetization (RL M) is either parallel or anti-parallel. In this example, the initial magnetic angle between the free layer magnetization (FL M) and the reference layer magnetization (RL M) is parallel, as indicated by an FL M arrow 522 that is parallel with a local RL moment 524. Consequently, a spin-transfer torque of the pMTJ 500 is zero, which prevents switching. The initial angle of the magnetizations between the reference layer interface 520R and the free layer interface 520F may be adjusted by not physically correlating the reference layer interface 520R and the free layer interface 520F of the barrier layer 520, as shown in FIG. 5B.

FIG. 5B illustrates a pMTJ 550, in which an initial magnetic angle of magnetization between a free layer and a reference layer is set by a reference layer interface not physically correlating with a free layer interface according to aspects of the present disclosure. In this arrangement, the reference layer interface 520R of a barrier layer 560 is similar to the configuration shown in FIG. 5A. In FIG. 5B, however, a free layer interface 560F is treated to prevent physical correlation between the free layer interface 560F and the reference layer interface 520R. That is, the free layer magnetization FL M no longer corresponds to the reference layer magnetization RL M due to treatment of the free layer interface 560F of the barrier layer 560.

In one aspect of the present disclosure, a plasma treatment is applied to a surface of the barrier layer 520 that faces the free layer, which is referred to as the free layer interface 560F. This treatment of the free layer interface 560F induces an interface that is different compared to the reference layer interface 520R. Advantageously, the non-conformal interfaces of the barrier layer 520 induce an angle of magnetization between the reference layer and the free layer that is neither parallel nor anti-parallel. Although FIG. 5B illustrates treatment of the free layer interface 560F, it should be recognized that the reference layer interface 520R may be treated to prevent physical correlation between the free layer interface 560F and the reference layer interface 520R.

In this aspect of the present disclosure, the direction of a local FL moment 562 is no longer in parallel with the direction of the local RL moment 524 due to lack of correspondence between the free layer magnetization FL M and the reference layer magnetization RL M. The non-conformal interfaces of the barrier layer 520, therefore, induce an angle of magnetization between the reference layer and the free layer without incurring an incubation time delay. As a result, the pMTJ 550 may enable an STT-MRAM for high speed switching, low current applications, such as cache memory (e.g., level three (L3) or level four (L4) cache memory).

Figure 6A:
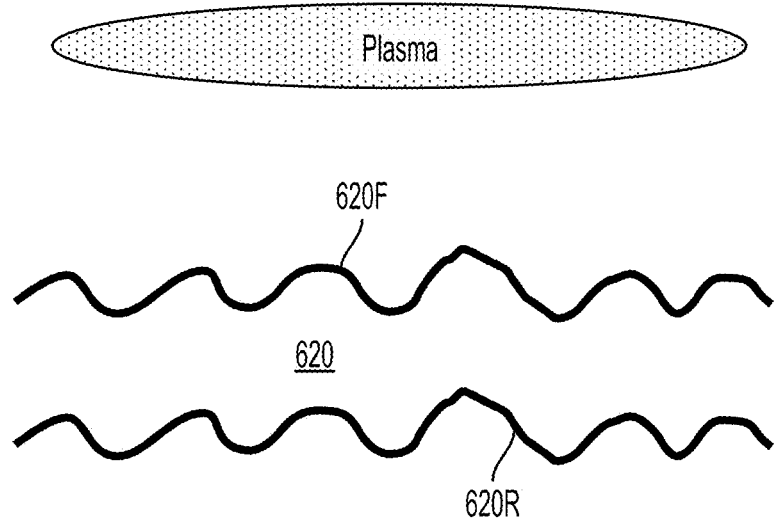
FIGS. 6A and 6B illustrate plasma treatment of a barrier layer interface according to aspects of the present disclosure.
Figure 6B:
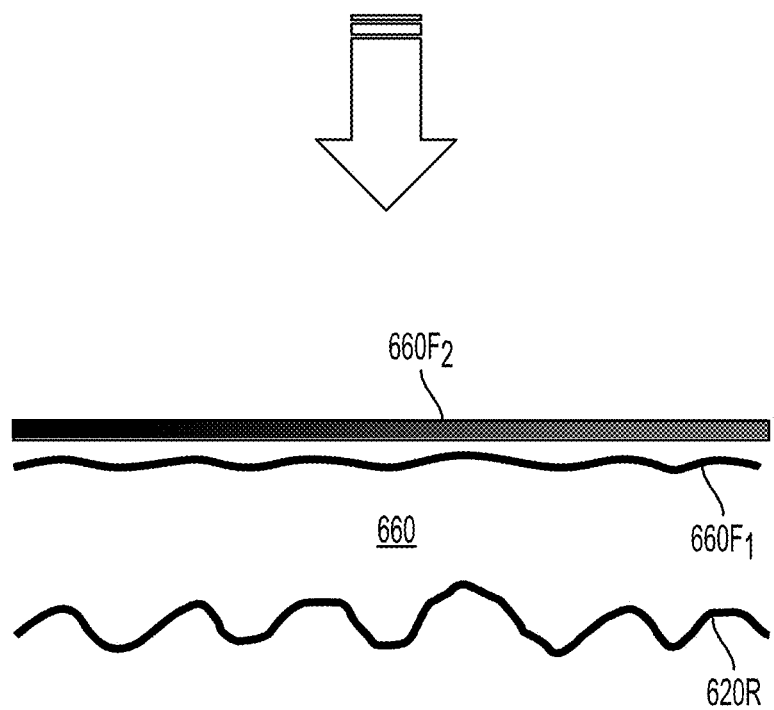

FIGS. 6A and 6B illustrate plasma treatment of a barrier layer interface according to aspects of the present disclosure. Representatively, a barrier layer 620 includes a free layer interface 620F that faces a free layer (not shown) and a reference layer interface 620R that faces a reference layer (not shown). In this example, a plasma treatment of the free layer interface 620F is performed. Although a plasma treatment is described, it should be recognized that other forms of treating the free layer interface 620F are contemplated according to aspects of the present disclosure. For example, the free layer interface 620F may be subjected to a smoothing process and the reference layer interface 620R may be subjected to a roughing process. Regardless of the treatment process, aspects of the present disclosure are directed to preventing physical correlation between the free layer interface 620F and the reference layer interface 620R, for example, as shown in FIG. 6B.

In the arrangement shown in FIG. 6B, a multi-layer free layer interface (e.g., $660F_1$ and $660F_2$) of a barrier layer 660 is shown. In this example, a first free layer interface $660F_1$ is treated to prevent physical correlation with the reference layer interface 620R. Once treated, a second free layer interface $660F_2$ is deposited on the first free layer interface $660F_1$. The second free layer interface $660F_2$ may further smooth the first free layer interface $660F_1$ to prevent physical correlation with the reference layer interface 620R.

Figure 7:
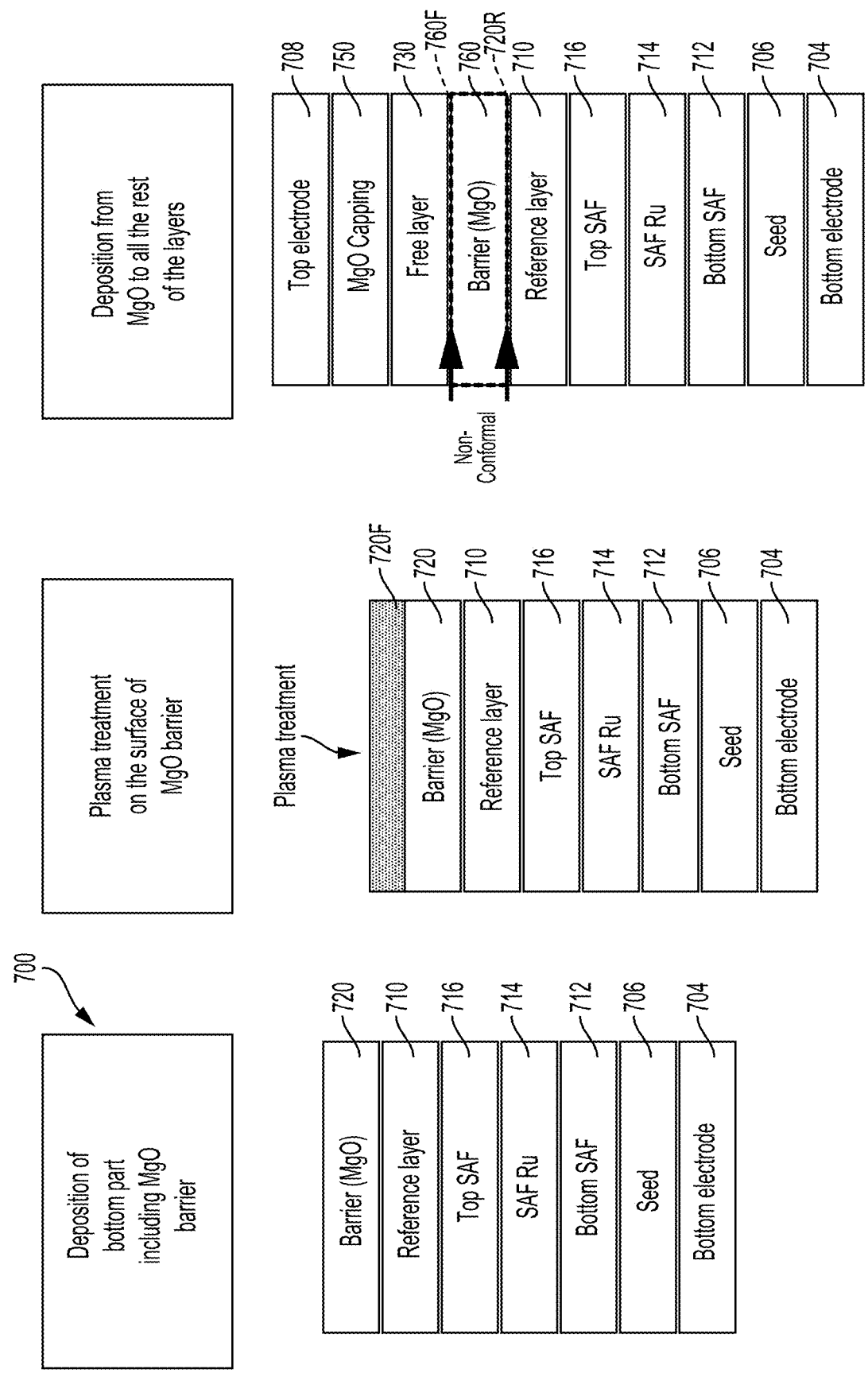
FIG. 7 illustrates treatment of a barrier layer interface of a pMTJ structure according to aspects of the present disclosure.

FIG. 7 illustrates treatment of a barrier layer interface of a pMTJ structure according to aspects of the present disclosure. Representatively, a pMTJ structure 700 may include a first electrode 704 (e.g., a bottom electrode) and a seed layer 706. The pMTJ structure 700 may also include a first synthetic antiferromagnetic (SAF) layer 712 (e.g., bottom SAF), a SAF coupling layer 714, and a second SAF layer 716 (e.g., top SAF). The pMTJ structure 700 also includes a reference layer 710 on the second SAF layer and a barrier layer 720 on the reference layer 710.

In this aspect of the present disclosure, a plasma treatment is applied to a free layer interface 720F of the barrier layer 720 to form an engineered barrier layer 760 including a free layer interface 760F that does not physically conform to a reference layer interface 720R. In this arrangement, the pMTJ structure 700 also includes a cap layer 750 (also known as a capping layer, such as a magnesium oxide (MgO) capping layer) on the free layer 730, and a second electrode 708 (e.g., top electrode) on the cap layer 750. The pMTJ structure 700 may be a part of various types of devices, such as a semiconductor memory device (e.g., MRAM).

Figure 8A:
FIGS. 8A and 8B illustrate treatment of a barrier layer interface according to aspects of the present disclosure.
Figure 8B:

FIGS. 8A and 8B illustrate treatment of a barrier layer interface according to aspects of the present disclosure. FIG. 8A shows an MgO barrier layer 820 including a free layer interface 820F that is physically correlated to a reference layer interface 820R. That is, the free layer interface 820F and the reference layer interface 820R exhibit a matching conformal roughness. FIG. 8B shows an engineered barrier layer 860 having a free layer interface 860F that is uncorrelated with the reference layer interface 820R. In this aspect of the present disclosure, a plasma treatment of the free layer interface 860F prevents physical correlation between the free layer interface 860F and the reference layer interface 820R.

Figure 9:
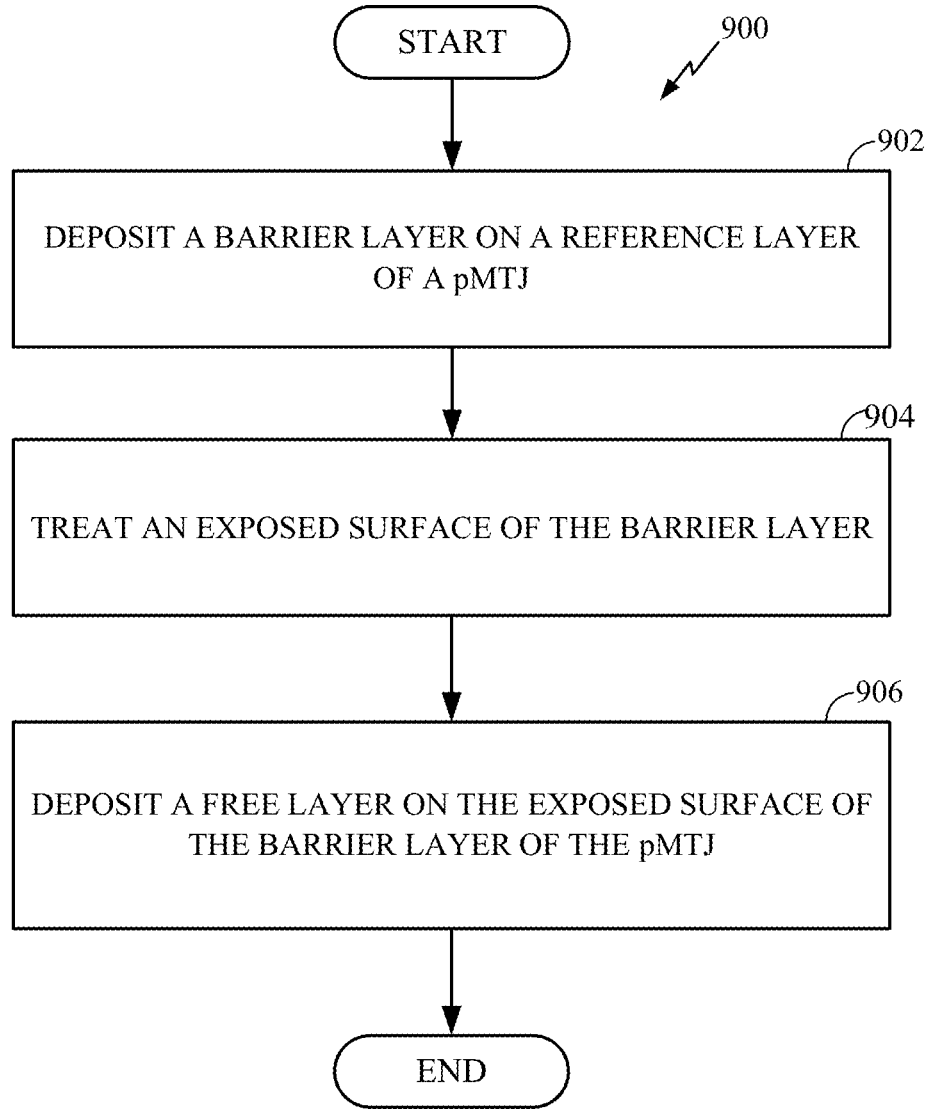
FIG. 9 is a process flow diagram illustrating a method of making a perpendicular magnetic tunnel junction according to aspects of the present disclosure.

FIG. 9 is a process flow diagram illustrating a method of making a perpendicular magnetic tunnel junction (pMTJ) according to aspects of the present disclosure. In method 900, at block 902, a barrier layer is deposited on a reference layer of a pMTJ. For example, a barrier layer 720 may be deposited on a reference layer 710, as shown in FIG. 7. At block 904, an exposed surface of the barrier layer is treated. For example, as shown in FIG. 7, an exposed surface (e.g., the free layer interface 720F) of the barrier layer 720 is treated to form an engineered barrier layer 760 having a free layer interface 760F that does not physically correlate with an opposing surface (e.g., the reference layer interface 720R) of the engineered barrier layer 760. Treating the exposed surface of the barrier layer may include in-situ treating of the exposed surface of the barrier layer. At block 906, a free layer is deposited on the exposed surface of the barrier layer of the pMTJ. For example, as shown in FIG. 7, the free layer 730 is deposited on the free layer interface 760F of the engineered barrier layer 760.

According to an aspect of the present disclosure, an MRAM array may include bit cells, in which each bit cell includes a pMTJ. The pMTJ includes a barrier layer between a free layer and a reference layer. The barrier layer may include a reference layer interface that faces the reference layer. The barrier layer may also include means for inducing an initial angle of magnetization between the reference layer and the free layer. The inducing means may be the free layer interface 560F/660F2/760F/860F, as shown in FIGS. 5B, 6B, 7 and 8B. In another aspect, the aforementioned means may be any module or any apparatus or material configured to perform the functions recited by the aforementioned means.

Spin-transfer torque efficiency and retention are design parameters for an embedded STT-MRAM that are improved when a perpendicular MTJ is used as a memory cell. As a result, perpendicular STT-MRAM is a leading candidate for providing next-generation embedded non-volatile memory. While perpendicular STT-MRAM is a promising candidate for use as a unified memory for a low power MCU (memory control unit) or IoT (Internet of things) applications, perpendicular STT-MRAM is still not fast/low-power enough to serve as cache replacement memory (e.g., low level cache (LLC) or otherwise).

In aspects of the present disclosure, a perpendicular MTJ may include a reference (e.g., fixed) layer, a free layer, and a barrier layer between the reference layer and the free layer. The barrier layer may include a free layer interface that faces the free layer and a reference layer interface that faces the reference layer. An initial angle of the magnetizations between the reference layer and free layer may be adjusted by not physically correlating the free layer interface with the reference layer interface of an engineered barrier layer. According to aspects of the present disclosure, the initial angle of magnetization between the free layer and the reference layer may be set by the free layer interface not physically correlating with the reference layer interface.

Figure 10:
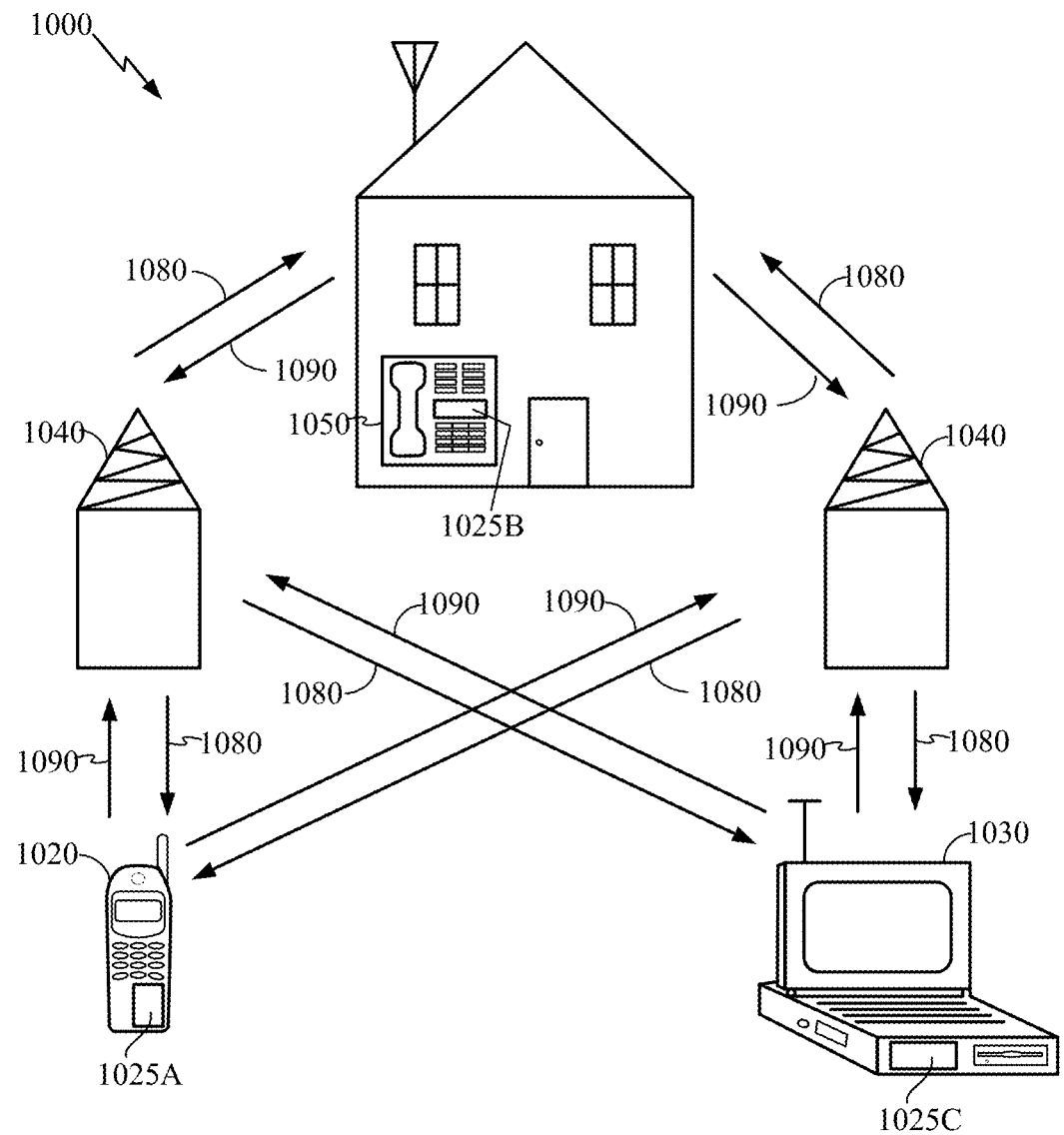
FIG. 10 is a block diagram showing an exemplary wireless communication system in which a configuration of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed pMTJ devices. It will be recognized that other devices may also include the disclosed pMTJ devices, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be a mobile phone, a hand-held personal communication systems (PCS) unit, a portable data unit such as personal digital assistant (PDA), a GPS enabled device, a navigation device, a set top box, a music player, a video player, an entertainment unit, a fixed location data unit such as a meter reading equipment, or a communications device that stores or retrieves data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed pMTJ devices.

Figure 11:
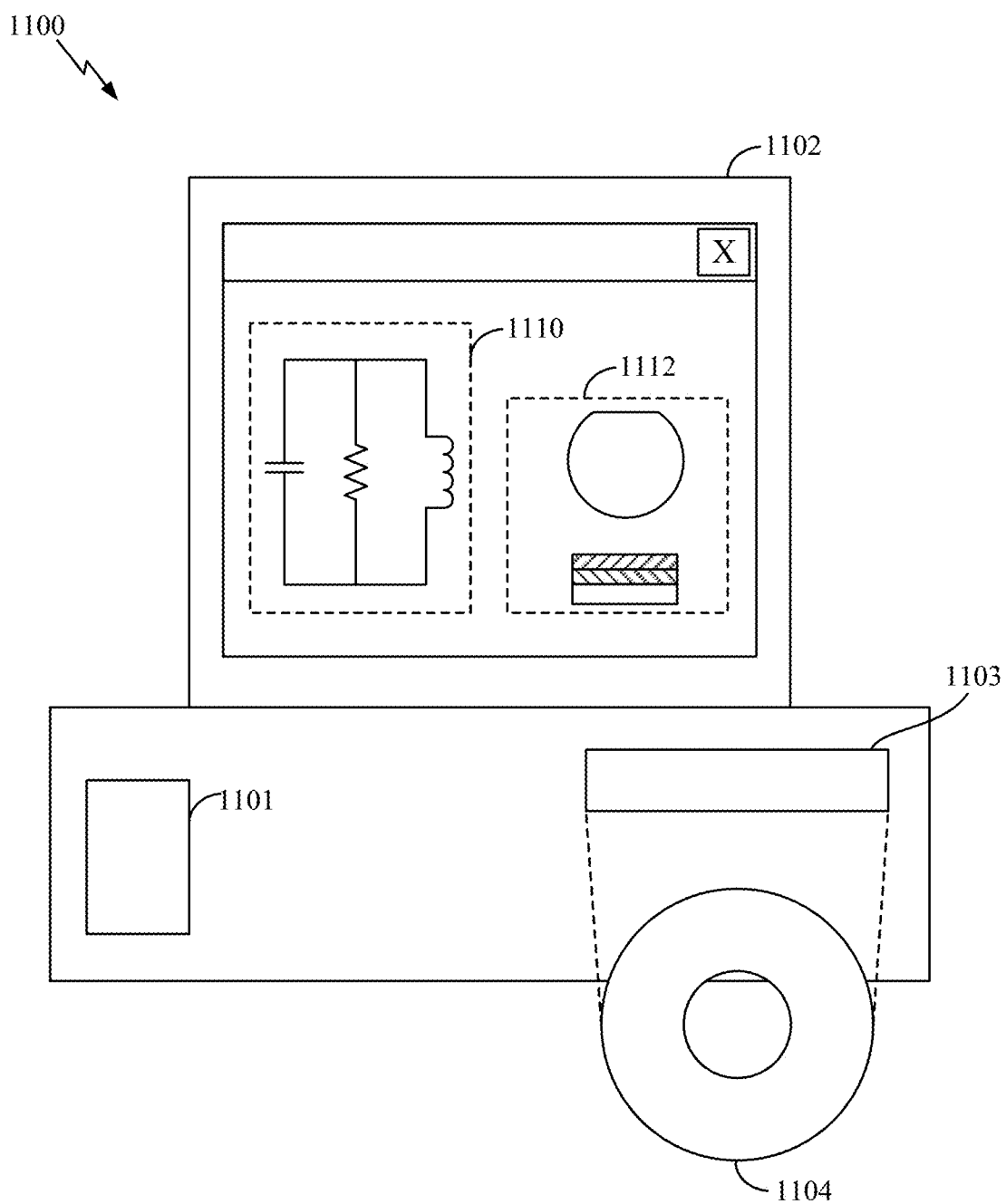
FIG. 11 is a block diagram illustrating a design workstation used for circuit, layout, and logic design of a semiconductor component according to one aspect of the present disclosure.

FIG. 11 is a block diagram illustrating a design workstation used for circuit, layout, and logic design of a semiconductor component, such as the perpendicular magnetic tunnel junction (pMTJ) structures disclosed above. A design workstation 1100 includes a hard disk 1101 containing operating system software, support files, and design software such as Cadence or OrCAD. The design workstation 1100 also includes a display 1102 to facilitate design of a circuit 1110 or a semiconductor component 1112 such as a perpendicular magnetic tunnel junction structure in accordance with an aspect of the present disclosure. A storage medium 1104 is provided for tangibly storing the design of the circuit 1110 or the semiconductor component 1112. The design of the circuit 1110 or the semiconductor component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the semiconductor component 1112 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core), or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A method of making a perpendicular magnetic tunnel junction (pMTJ), comprising:
    depositing a barrier layer on a reference layer of the pMTJ;
    treating an exposed surface of the barrier layer, the exposed surface of the barrier layer not physically correlating with an opposing surface of the barrier layer, by:
        roughing the opposing surface of the barrier layer, and smoothing the exposed surface of the barrier layer;
    depositing a free layer on the exposed surface of the barrier layer of the pMTJ; and
    forming a cap layer on a surface of the free layer opposite the exposed surface of the barrier layer.

2. The method of claim 1, in which treating comprises plasma treating the exposed surface of the barrier layer.

3. The method of claim 1, in which treating comprises in-situ treating of the exposed surface of the barrier layer.

4. The method of claim 1, in which the exposed surface of the barrier layer faces the free layer and the opposing surface of the barrier layer faces the reference layer.

5. The method of claim 1, further comprising incorporating the pMTJ into at least one of a music player, a video player, an entertainment unit, a navigation device, a communications device, a personal digital assistant (PDA), a fixed location data unit, a mobile phone, and a portable computer.

* * * * *